United States Patent [19]

Leonov

[11] Patent Number: 4,676,699

[45] Date of Patent: Jun. 30, 1987

[54] SEMICONDUCTOR WAFER GUIDES

[75] Inventor: Mark Leonov, Santa Clara, Calif.

[73] Assignee: Intel Corporation, Santa Clara, Calif.

[21] Appl. No.: 930,012

[22] Filed: Nov. 5, 1986

Related U.S. Application Data

[63] Continuation of Ser. No. 722,731, Apr. 11, 1985, abandoned.

[51] Int. Cl.⁴ .............................................. B65G 51/03
[52] U.S. Cl. ...................................................... 406/86
[58] Field of Search .................................... 406/86, 88

[56] References Cited

U.S. PATENT DOCUMENTS 3,582,144  6/1971  Woolard ............................... 406/88
4,131,320 12/1978  Volat et al. ........................... 406/88
4,352,607 10/1982  Loveless et al. ...................... 406/88

Primary Examiner—Jeffrey V. Nase
Attorney, Agent, or Firm—Blakely, Sokoloff, Taylor & Zafman

[57] ABSTRACT

A device for positioning and proving movement to a semiconductor wafer. A pair of elongated members are attached to either side of a plate which is used during the processing of semiconductor wafers. The members are angled away from the center of the plate at the end which receives the wafer. Angled openings in the members are connected to a gas source which shoots a gas, such as air, from the openings to a assist in propelling the wafer and to prevent the wafer from contacting the member itself. The openings may also be used to introduce different atmospheres to the environment of the wafers during processing.

5 Claims, 6 Drawing Figures

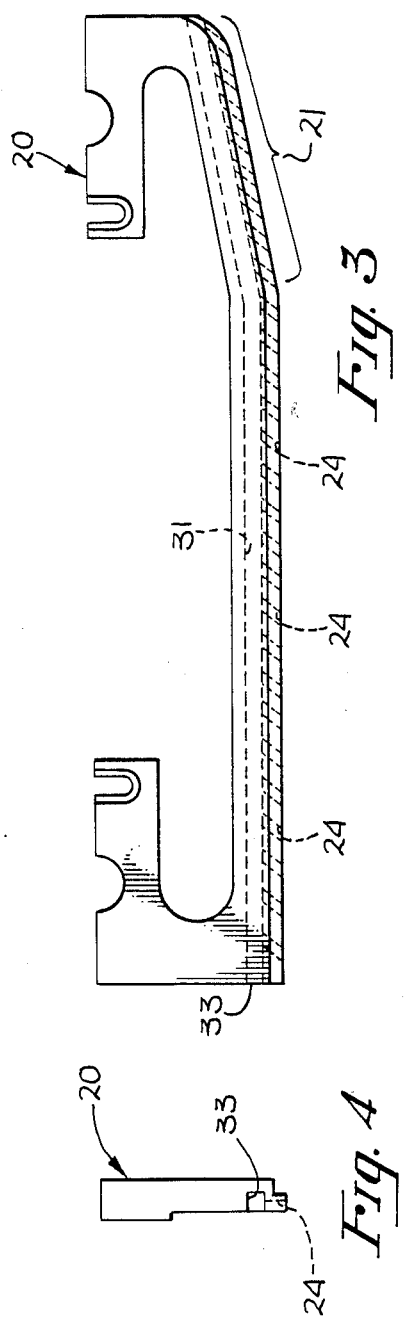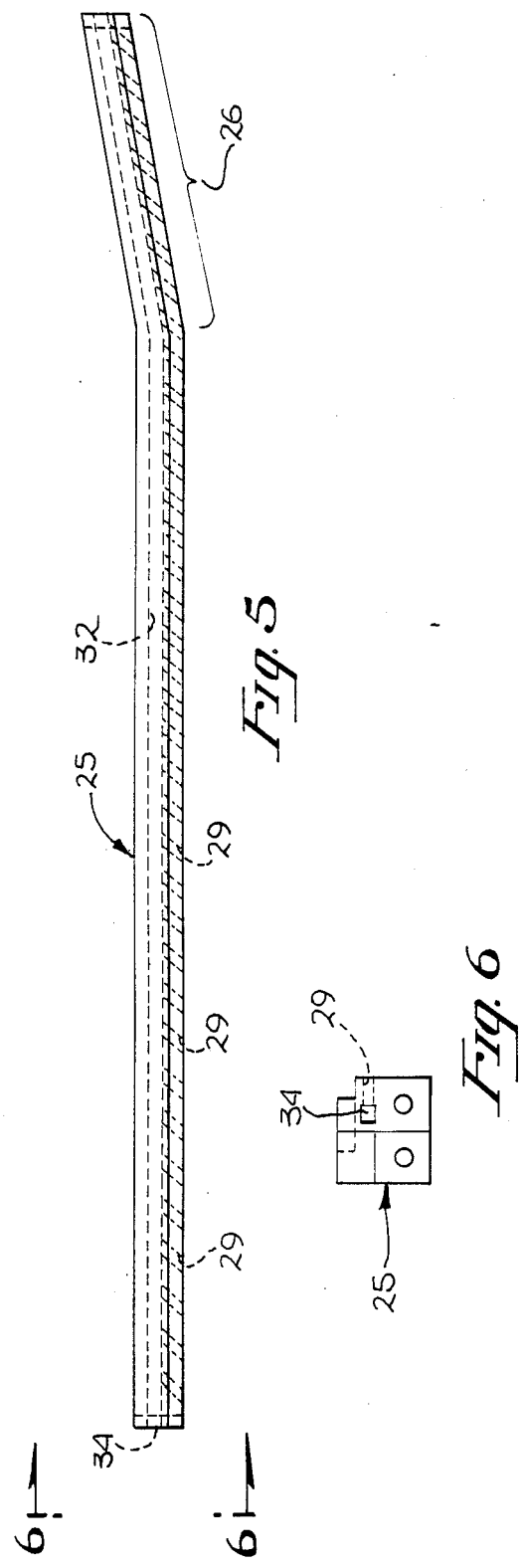

SEMICONDUCTOR WAFER GUIDES

This is a continuation of application Ser. No. 722,731 filed Apr. 11, 1985, now abandoned.

BACKGROUND OF THE INVENTION

1. Field of the Invention

This invention relates to the field of wafer processing in the manufacture of semiconductor devices and more specifically to a method for containing the wafer in a specified area on the processing line.

2. Prior Art

During the processing of semiconductors, wafers are used from which many devices are formed. It is sometimes desirable to subject these wafers to heat, apply a coating, and then to cool them down. In the prior art this is accomplished by resting the wafer on a hot plate and heating it to the desired temperature, applying the coating to the wafer, and then transporting the wafer to a cooling plate in order to return it to ambient temperature. These plates typically are smooth surfaces containing holes in the upper surface from which air is propelled to assist in moving the wafer from one plate to another. In order to prevent the wafers from falling off the plates, and to keep them generally disposed in the center of the plates, wafer guides are employed. These guides are typically a pair of teflon bars, one bar on each side of the plate and of sufficient thickness such that a wafer contacting the guide will be restrained from lateral movement off the plate.

There are several disadvantages associated with prior art wafer guides. First, the guides are straight, and because of different processing needs, are placed at varying distances from the edge of the plates on which they are used. When a wafer moves from a plate with widely spaced guides to a plate with more narrowly spaced guides, the wafer can get stuck or slowed at the leading edge of the narrower guides. Second, when the wafer comes in contact with the guide, microcracks and microfractures are formed in the wafer. These cracks are too small to be detected by eye, but result in reduced yield of the wafer.

It is an object of the present invention to solve both of the above disadvantages by a simple yet effective solution.

SUMMARY OF THE PRESENT INVENTION

The present invention utilizes wafer guides that are angled outward at the leading edge in order to reduce the likelihood that a wafer will become stuck at that location. In addition, the wafer guides of the present invention contain airholes which help in preventing the wafer from touching the guide when the wafer is proximate to the guide. Further, these airholes aid in transporting the wafer, keeping particles from the surface of the wafer, and cooling the wafer when that is desired. These holes can also be used to introduce different gases to the environment of the wafer when that is desired.

BRIEF DESCRIPTION OF THE DRAWINGS

FIG. 3 illustrates a top view of one embodiment of the present invention.

FIG. 4 illustrates an end view of the guide of FIG. 3.

FIG. 5 illustrates a top view of an alternate embodiment of the present invention. FIG. 6 illustrates an end view of the guide of FIG. 5.

DETAILED DESCRIPTION OF THE PRESENT INVENTION

Prior Art Wafer Guides

Figure 1:
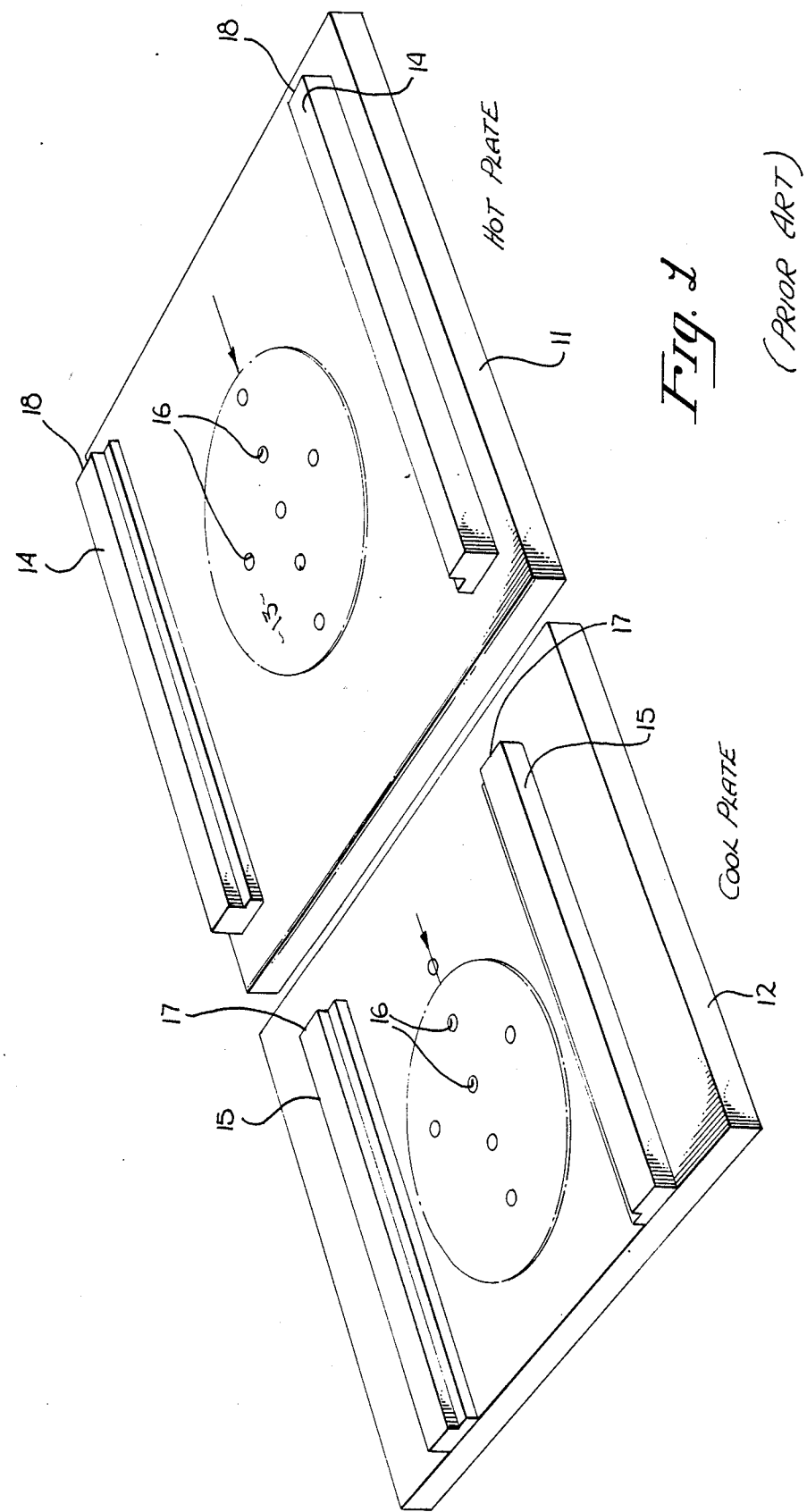
FIG. 1 illustrates a perspective view of prior art wafer guides.

During the processing of semiconductor wafers, it is often desired to prepare them for the application of photoresist. The method of doing this is illustrated in FIG. 1. First, they are subjected to heating on a hot plate 11 of FIG. 1, and then transferred to a cool plate 12. In order to keep the wafer 13 in the center of the hot plate 11, wafer guides 14 are utilized. Holes 16, in the surface of the hot plate 11 are air jets which are used to help move the wafer 13 forward. While on the hot plate 11, the wafer is heated and exposed to HMDS gas to improve the adhesion of the photoresist to the wafer. After heating, the wafer 13 is moved to the cool plate 12. There wafer guides 15, position the wafer 13 in the center of the cool plate 12 while cooling takes place. The wafers are then transferred to a vacuum chuck for the application of photoresist.

Because the wafer guides 14 and 15 on each plate are straight, problems occur. When coming onto hot plate 11, the wafer sometimes gets stuck at areas 18, the leading edge of the wafer guides 14. Similarly, when moving from the hot plate 11 to the cool plate 12, the wafer often becomes stuck at area 17, the front surfaces of the wafer guides 15. Even when the wafer 13 does not get stuck at area 17, the wafer usually contacts those areas or some other areas of the wafer guides. This contact leads to microfractures and microcracks in the wafer 13.

Present Invention

Wafer guides used in semi-conductor wafer processing are described. The guides are angled to improve the transition of a wafer from plate to plate and contain air jets to both aid in moving the wafer and to prevent the wafer from contacting the guides themselves. In the following description, numerous specific details are set forth, such as size of wafer, etc., in order to provide a thorough understanding of the present invention. It will be obvious however, to one skilled in the art, that the present invention may be practiced without these specific details. In other instances, well-known structures have not been shown in detail in order not to unnecessarily obscure the present invention.

Figure 2:
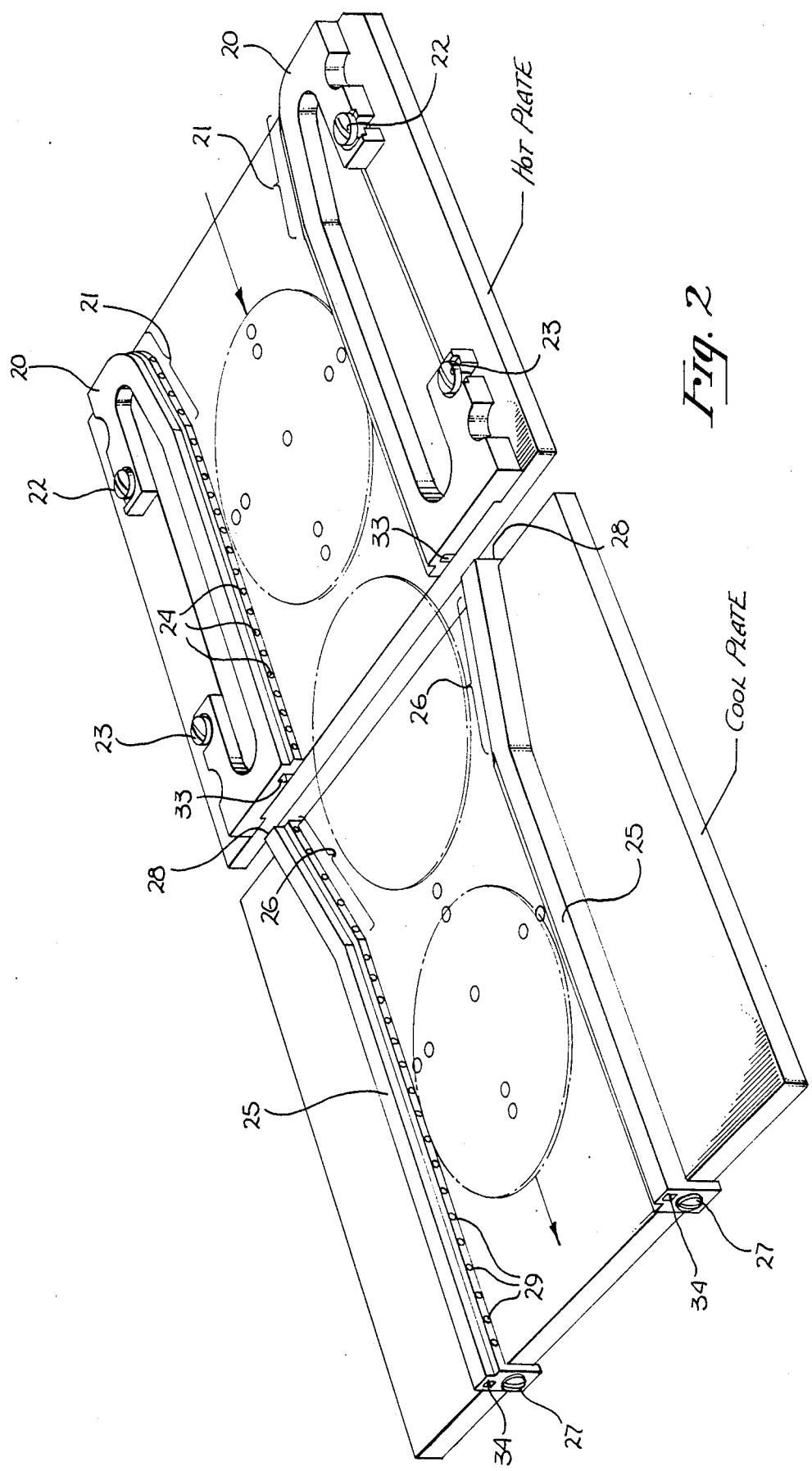
FIG. 2 illustrates a perspective view of the wafer guides of the present invention.

The preferred emodiment of the present invention is shown on the hot plate of FIG. 2. The wafer guide 20 is angled at the end of the plate which receives the wafers. This angled area 21 aids in preventing wafers from being slowed or stopped as they enter the hot plate area. The wafer guide 20 is attached to the plate at areas 22 and 23 in the preferred embodiment by set screws. It would be obvious however, to one skilled in the art, that alternate methods of attaching the wafer guide 20 could be practiced.

An alternate embodiment to the present invention is shown on the cool plate. This wafer guide 25, like the wafer guide 20 on the hot plate, has an angled area 26 at the end of the plate which receives the wafers to prevent slowing or stopping of the wafers at that area. In this alternate embodiment, the wafer guide 25 is attached to the plate by means of extended members 27 and 28 which contact the front and rear faces of the cool plate. The ledge areas on both wafer guide 20 and wafer guide 25 are convenient areas to place a spacer or other measuring device so that the distance between the wafers on a plate may be controlled.

A novel feature of the present invention is the use of openings in the guides. These can be seen as openings 24 of guide 20 and openings 29 of guide 25. Although FIG. 2 shows the openings as being formed in the guide itself, a teflon tube containing openings could be mounted in the same location in front of the guides. These opening are in reality gas jets, and are connected to a gas source such as air. These openings serve four important functions. First, they can be made to eject air to assist in transporting the wafer along the length of the plates. Secondly, they assist in maintaining a particle free environment on the surface of the plates and the surface of the wafers. Thirdly, they can be used to cool the wafer, specifically when it rests on the cool plate. Fourth, and most importantly, the openings permit the guides to act as air guides, preventing the wafer from contacting the guides themselves and risking microcracks. The air shooting from the openings has sufficient force to prevent the wafer from touching the guides during normal operation.

An additional advantage of the openings, specifically on the hot plate, is their use as a means to introduce HMDS gas to the wafer during that processing step.

The novel use of angled wafer guides containing built in gas jets, results in a wafer guide which solves problems created by the use of prior art wafer guides.

The preferred embodiment of the present invention is illustrated in FIGS. 3 and 4. The top view of FIG. 3 shows wafer guide 20. The angled area 21 should be of sufficient angle such that the wafer guides are wider apart at that location than the wafer guides of the previous plate. A hollow area of the guide 31 extends along the length of the guide behind the face of the guide which is nearest the wafer. A source of gas, such as air or HMDS, can be attached to this hollow opening 31 at location 33 at the end of the guide 20. As shown in FIG. 3, the openings 24 extend from the hollow area through to the face of the wafer guide. As shown, the openings 24 are angled in the direction of travel of the wafer. This angle promotes more efficient propulsion of the wafer as it travels along the plate. The openings 24 extend along the length of the guide 20, into the angled area 21. This area of the guide is critical, for it is the most likely location for contact between wafer and guide. The force of the gas ejected from the holes must be sufficient such that a wafer in proximity with the base of the wafer guide will be repulsed before contact is made. This prevents the formation for microcracks and microfractures in the wafer itself which reduced the yield of the wafer. Different gas sources can be connected to the opening 33 so that if desired, different environments may be provided for the wafer while it is on the plate. For example, HMDS gas could be introduced to the wafer through the openings 24 of wafer guide 20.

An alternate form of the present invention is shown in FIGS. 5 and 6. A hollow area 32 extends the length of the guide 25. Angled openings 29 extend from the hollow area to the face of the guide. An opening 34 at the end of the guide permits the attachment of a gas source to propel gas through the openings 29.

The guides are comprised of teflon or a combination of teflon and delrin in the preferred embodiment. Any suitable material may be utilized which will not deform at high temperatures.

Thus, angled wafer guides which include the use of angled openings for aiding in the propulsion of a wafer or introducing different atmospheres to the wafer are described.

I claim:

1. A semiconductor wafer guide comprising: a first set of elongated side members extending along a first flat fluid bearing surface, said first set attached to said first surface and disposed parallel to one another and separated by a first distance ($d_1$) where $d_1$ is greater than a width of a semiconductor wafer;

a second set of elongated side members extending along a second flat fluid bearing surface, said second set attached to said second surface and disposed parallel to one another and separated by a second distance $d_2$, where $d_2$ is greater than said width of said wafer;

said second set having outwardly angled proximal ends, wherein distance between said side members decrease from a distance greater than $d_2$ at said proximal ends to said distance $d_2$ at a point interior from said proximal ends;

opposing faces of each set of said elongated side members having openings formed therein, said openings connected to a source of gas, said gas being propelled from said openings to channel said wafers in direction of wafer flow so as to prevent said wafer from contacting said elongated side members and to prevent wafers from developing microcracks through contact with said elongated side members said second surface placed adjacent to said first surface so as to form a predetermined path along which said semiconductor wafer will travel, and wherein said wafer exiting from between said first set of side members travels into a enlarged opening provided by said proximal ends of said second set of side members;

whereby a smooth transition is acheived for said wafer moving from said frist surface to said second surface.

2. The wafer guide defined in claim 1, wherein said first set of side members also having outwardly angled proximal ends.

3. The wafer guide defined in claim 2, wherein $d_1$ and $d_2$ are equivalent.

4. The wafer guide of claim 1 wherein said source of gas provides a gas for coating said wafer.

5. The wafer guide of claim 1 wherein said source of gas provides temperature controlled gas for controlling the temperature of said wafer.

* * * * *